US012696609B2

(12) United States Patent (10) Patent No.: US 12,696,609 B2
Kobayashi et al. (45) Date of Patent: Jul. 28, 2026

(54) ZINC OXIDE LAMINATE FOR AN ORGANIC THIN FILM SOLAR CELL

(71) Applicant: JFE Steel Corporation, Tokyo (JP)

(72) Inventors: Hikaru Kobayashi, Tokyo (JP); Mikito Suto, Tokyo (JP); Yusuke Fushiwaki, Tokyo (JP); Akira Matsuzaki, Tokyo (JP)

(73) Assignee: JFE Steel Corporation, Tokyo (JP)

( * ) Notice: Subject to any disclaimer, the term of this patent is extended or adjusted under 35 U.S.C. 154(b) by 359 days.

(21) Appl. No.: 18/684,247

(22) PCT Filed: Jul. 8, 2022

(86) PCT No.: PCT/JP2022/027120
§ 371 (c)(1),
(2) Date: Feb. 16, 2024

(87) PCT Pub. No.: WO2023/026704
PCT Pub. Date: Mar. 2, 2023

(65) Prior Publication Data
US 2024/0431126 A1 Dec. 26, 2024

(30) Foreign Application Priority Data
Aug. 24, 2021 (JP) ................................. 2021-136269

(51) Int. Cl.
H10K 30/82 (2023.01)
H10K 30/57 (2023.01)
(Continued)

(52) U.S. Cl.
CPC ............. H10K 30/82 (2023.02); H10K 30/57 (2023.02); H10K 30/85 (2023.02); H10K 30/86 (2023.02);
(Continued)

(58) Field of Classification Search
CPC ........ H10K 71/50; H10K 39/32; H10K 50/81; H10K 2102/103; H10K 30/82; H10K 30/85; H10K 30/57; H10K 30/86
See application file for complete search history.

(56) References Cited

U.S. PATENT DOCUMENTS

2022/0029115 A1 1/2022 Suto et al.

FOREIGN PATENT DOCUMENTS

CN 105900255 A * 8/2016 ............. H10K 85/50
CN 109873081 A 6/2019
(Continued)

OTHER PUBLICATIONS

International Search Report (PCT/ISA/210) with translation and Written Opinion (PCT/ISA/237) mailed on Aug. 16, 2022, by the Japan Patent Office as the International Searching Authority for International Application No. PCT/JP2022/027120. (8 pages).
(Continued)

*Primary Examiner* — Alonzo Chambliss
(74) *Attorney, Agent, or Firm* — Buchanan Ingersoll & Rooney PC

(57) ABSTRACT

A laminate including a member that serves as a light-transmissive electrode layer and a zinc oxide layer that serves as an electron transport layer for an organic thin-film solar cell is provided. The zinc oxide layer has a Zn deposition amount of not less than 20.0 mg/m$^2$ and not more than 120.0 mg/m$^2$. An S value represented by Formula (1) is not more than 0.90 when, in the zinc oxide layer, an oxygen 1s spectrum obtained by X-ray photoelectron spectroscopy is separated into three peaks, an area of a peak in which a binding energy of a peak top is in a range of not less than 529.0 eV and less than 530.7 eV is represented by α, and an
(Continued)

area of a peak in which a binding energy of a peak top is in a range of not less than 530.7 eV and less than 532.2 eV is represented as β:

$$S = \beta/(\alpha + \beta). \qquad (1)$$

4 Claims, 1 Drawing Sheet

(51) Int. Cl.

| | | |
|---|---|---|
| *H10K 30/85* | (2023.01) | |
| *H10K 30/86* | (2023.01) | |
| *H10K 39/32* | (2026.01) | |
| *H10K 50/81* | (2023.01) | |
| *H10K 71/50* | (2023.01) | |
| *H10K 102/10* | (2023.01) | |

(52) U.S. Cl.
CPC ............. *H10K 39/32* (2023.02); *H10K 50/81* (2023.02); *H10K 71/50* (2023.02); *H10K 2102/103* (2023.02)

(56) References Cited

FOREIGN PATENT DOCUMENTS

| | | | |
|---|---|---|---|
| CN | 110600617 A | | 12/2019 |
| CN | 111244289 A | | 6/2020 |
| CN | 112038363 A | | 12/2020 |
| CN | 113292095 A | | 8/2021 |
| JP | 2000-328220 A | | 11/2000 |
| JP | 2009146981 A | | 7/2009 |
| JP | 2013254900 A | * | 12/2013 |
| JP | 2016127160 A | * | 7/2016 |
| KR | 20210049659 A | | 5/2021 |
| TW | 201401601 A | | 1/2014 |
| TW | I689562 B | | 4/2020 |
| WO | 2020/121998 A1 | | 6/2020 |

OTHER PUBLICATIONS

Office Action dated Jul. 17, 2023 issued by the Taiwanese Patent Office in corresponding Taiwan Patent Application No. 111130694 with concise statement of relevance. (5 pages).

Kumar et al., "Flexible, Low-Temperature, Solution Processed ZnO-Based Perovskite Solid State Solar Cells", Chemical Communications, (Oct. 8, 2013), vol. 49, No. 94, p. 11089-11091.

Kumar et al., "Supplementary Information: Flexible, Low-Temperature, Solution Processed ZnO-Based Perovskite Solid State Solar Cells", Chemical Communications, (Oct. 8, 2013), XP93196548, 5 pages.

Pradhan et al., "Controlled Growth of Two-Dimensional and One-Dimensional ZnO Nanostructures on Indium Tin Oxide Coated Glass by Direct Electrodeposition", Langmuir, (Sep. 2, 2008), vol. 24, No. 17, pp. 9707-9716.

Wang et al., "Synthesis, Properties and Applications of ZnO Nanomaterials with Oxygen Vacancies: A Review", Ceramics International, (Feb. 3, 2018), vol. 44, No. 7, pp. 7357-7377.

Zhang et al., "Low Temperature Cathodic Electrodeposition of Nanocrystalline Zinc Oxide Thin Films", Thin Solid Films, (Dec. 1, 2005), vol. 492, No. 1-2, pp. 24-29.

The extended European Search Report issued Sep. 13, 2024, by the European Patent Office in corresponding European Patent Application No. 22860995.4-1211. (11 pages).

Office Action (Request for Submission of an Opinion) issued Mar. 20, 2025, by the Korean Intellectual Property Office in corresponding Korean Patent Application No. 10-2024-7003808 and an English translation with Concise Statement of Relevance of the Office Action. (14 pages).

* cited by examiner

ZINC OXIDE LAMINATE FOR AN ORGANIC THIN FILM SOLAR CELL

CROSS REFERENCE TO RELATED APPLICATIONS

This is the U.S. National Phase application of PCT/JP2022/027120, filed Jul. 8, 2022, which claims priority to Japanese Patent Application No. 2021-136269, filed Aug. 24, 2021, the disclosures of each of these applications being incorporated herein by reference in their entireties for all purposes.

FIELD OF THE INVENTION

The present invention relates to a laminate, an organic thin-film solar cell, a method for producing a laminate, and a method for producing an organic thin-film solar cell.

BACKGROUND OF THE INVENTION

Conventionally, there has been known an organic thin-film solar cell of "normal type" that includes a light-transmissive electrode layer, a hole transport layer, an organic semiconductor layer, an electron transport layer and a collector electrode layer in this order.

In addition, in recent years, there has been proposed an organic thin-film solar cell of "inverted type" that includes a light-transmissive electrode layer, an electron transport layer, an organic semiconductor layer, a hole transport layer and a collector electrode layer in this order for the sake of improvement in durability and other properties (see Patent Literature 1).

PATENT LITERATURES

Patent Literature 1: JP 2009-146981 A

SUMMARY OF THE INVENTION

As described above, an organic thin-film solar cell includes, for instance, a light-transmissive electrode layer, an electron transport layer, an organic semiconductor layer, a hole transport layer and a collector electrode layer in this order.

Such an organic thin-film solar cell is required to demonstrate excellent output characteristics.

Accordingly, an object of the present invention is to provide a laminate that serves as a light-transmissive electrode layer and an electron transport layer of an inverted type organic thin-film solar cell including the light-transmissive electrode layer, the electron transport layer, an organic semiconductor layer, a hole transport layer and a collector electrode layer in this order, and that enables to obtain an organic thin-film solar cell having excellent output characteristics.

Another object of the present invention is to provide a new method for producing the laminate.

The present inventors found, through an earnest study, that employing the configuration described below enables the achievement of the above-mentioned objects, and the invention has been completed.

Specifically, the present invention according to exemplary embodiments provides the following [1] to [4].

The present invention makes it possible to provide a laminate that serves as a light-transmissive electrode layer and an electron transport layer of an organic thin-film solar cell including the light-transmissive electrode layer, the electron transport layer, an organic semiconductor layer, a hole transport layer and a collector electrode layer in this order, and that enables to obtain an organic thin-film solar cell having excellent output characteristics.

The present invention also makes it possible to provide a new method for producing the laminate.

DETAILED DESCRIPTION OF EMBODIMENTS OF THE INVENTION

[Organic Thin-Film Solar Cell]

First, an organic thin-film solar cell 1 is described with reference to FIG. 1.

Figure 1:
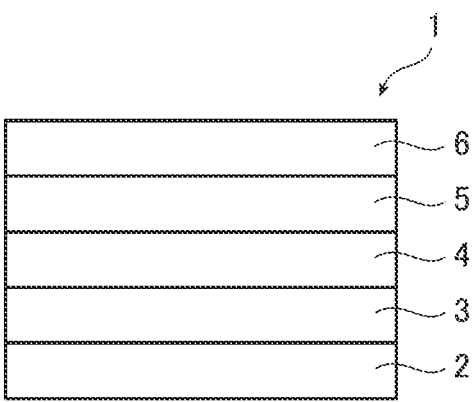
FIG. 1 is a cross-sectional view schematically showing an organic thin-film solar cell.

FIG. 1 is a cross-sectional view schematically showing the organic thin-film solar cell 1. The organic thin-film solar cell 1 includes, for instance, a light-transmissive electrode layer 2, an electron transport layer 3, an organic semiconductor layer 4, a hole transport layer 5 and a collector electrode layer 6 in this order.

The thickness of the light-transmissive electrode layer 2 is equivalent to the thickness of a member 8 (see FIG. 2) which will be described later.

The thickness of the electron transport layer 3 is equivalent to the thickness of a zinc oxide layer 9 (see FIG. 2) which will be described later.

The thicknesses of the organic semiconductor layer 4, the hole transport layer 5 and the collector electrode layer 6 are suitably set.

A preferable example of the light-transmissive electrode layer 2 is a conductive metal oxide film such as an ITO (Indium Tin Oxide) film or an FTO (Fluorine-doped Tin Oxide) film. The light-transmissive electrode layer 2 may be disposed on a transparent substrate such as a glass substrate or a resin film.

An example of the electron transport layer 3 is a zinc oxide layer containing zinc oxide (ZnO) that is an n-type semiconductor.

An example of the organic semiconductor layer 4 is a layer containing poly-3-hexylthiophene (P3HT) that is a polythiophene derivative and [6,6]-phenyl-$C_{61}$-butyric acid methyl ester (PCBM) that is a fullerene derivative.

The mass ratio between P3HT and PCBM (P3HT:PCBM) is preferably 5:3 to 5:6 and more preferably 5:3 to 5:4.

The organic semiconductor layer 4 as above may further contain additives such as a conductive material and a dye.

Examples of the conductive material include conductive materials of polyacetylene-based, polypyrrole-based, polythiophene-based, polyparaphenylene-based, polyparaphenylene vinylene-based, polythienylene vinylene-based, poly (3,4-ethylenedioxythiophene)-based, polyfluorene-based, polyaniline-based, and polyacene-based (except PEDOT/PSS to be described later).

Examples of the dye include dyes of cyanine-based, merocyanine-based, phthalocyanine-based, naphthalocyanine-based, azo-based, quinone-based, quinacridone-based, squarylium-based, triphenylmethane-based, xanthene-based, porphyrin-based, perylene-based, and indigo-based.

The additive content is preferably 1 to 100 parts by mass and more preferably 1 to 40 parts by mass with respect to 100 parts by mass in total of P3HT and PCBM.

Examples of materials for the hole transport layer 5 include PEDOT/PSS, vanadium oxide ($V_2O_5$), and molybdenum oxide ($MoO_3$), with PEDOT/PSS being preferred.

PEDOT/PSS is a high molecular compound having PEDOT (poly(3,4-ethylenedioxythiophene)) and PSS (polystyrene sulfonate) combined together, and is sometimes referred to as "PEDOT:PSS."

Examples of the collector electrode layer 6 include an Au electrode layer, an Ag electrode layer, an Al electrode layer, and a Ca electrode layer, and of these, an Au electrode layer is preferred.

[Laminate]

Next, a laminate 7 that serves as the light-transmissive electrode layer 2 and the electron transport layer 3 of the organic thin-film solar cell 1 (see FIG. 1) is described with reference to FIG. 2.

Figure 2:
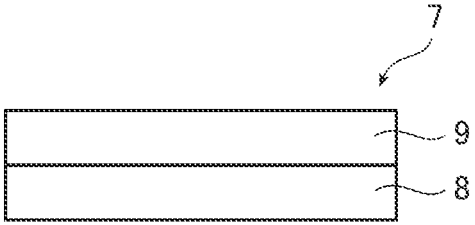
FIG. 2 is a cross-sectional view schematically showing a laminate.

FIG. 2 is a cross-sectional view schematically showing the laminate 7. The laminate 7 includes the member 8 that serves as the light-transmissive electrode layer 2 (see FIG. 1) and the zinc oxide layer 9 that is disposed on the member 8 and serves as the electron transport layer 3 (see FIG. 1).

<Member Serving as Light-Transmissive Electrode Layer>

The member 8 serving as the light-transmissive electrode layer 2 (see FIG. 1) is preferably a member having electrical conductivity and more preferably a member containing indium oxide or tin oxide.

In the case of being a member containing indium oxide, the member 8 is even more preferably a member containing indium tin oxide (ITO) and particularly preferably an ITO film.

In the case of being a member containing tin oxide, the member 8 is even more preferably a member containing fluorine-doped tin oxide (FTO) and particularly preferably an FTO film.

The member 8 may be disposed on a transparent substrate such as a glass substrate or a resin film.

The thickness of the member 8 that is for example an ITO film or an FTO film is appropriately specified in accordance with the resulting organic thin-film solar cell 1 (see FIG. 1) and is preferably not less than 20 nm, more preferably not less than 80 nm, and even more preferably not less than 150 nm, and, at the same time, preferably not more than 500 nm, more preferably not more than 400 nm, and even more preferably not more than 300 nm.

The thickness of the member 8 is a value determined by forming a cross section of the member 8 with a focused ion beam and measuring the formed cross section with a scanning electron microscope.

<Zinc Oxide Layer>

The zinc oxide layer 9 is a layer containing zinc oxide.

The zinc oxide layer 9 serves as the electron transport layer 3 (see FIG. 1) of the organic thin-film solar cell 1.

Upon light absorption, the electron transport layer 3 extracts electrons generated in the organic semiconductor layer 4 and suppresses backflow of holes to suppress recombination of electrons and holes, contributing to an improvement in the output characteristics.

Conventionally, titanium oxide, tin oxide, zinc oxide and the like are used as the material for the electron transport layer 3; of these, zinc oxide has an optimum energy level, a high electron mobility, a high transmittance, environmental stability and other properties.

4

<<Zn Deposition Amount>>

The zinc oxide layer 9 has a Zn deposition amount of not less than 20.0 $mg/m^2$ and not more than 120.0 $mg/m^2$. With this, the organic thin-film solar cell 1 using the laminate 7 has excellent output characteristics.

When the Zn deposition amount of the zinc oxide layer 9 is less than 20.0 $mg/m^2$, a region that is not covered with the zinc oxide layer 9 is prone to be present on a surface of the member 8. In this case, current leakage is likely to occur, resulting in insufficient output characteristics.

On the other hand, when the Zn deposition amount of the zinc oxide layer 9 exceeds 120.0 $mg/m^2$, transfer resistance of electrons generated in the organic semiconductor layer 4 adjacent to the electron transfer layer 3 (zinc oxide layer 9) increases, and this also results in a decrease in output.

However, any other mechanisms than the foregoing are also regarded as being within the scope of embodiments of the invention.

The Zn deposition amount of the zinc oxide layer 9 is preferably not less than 20.0 $mg/m^2$, and more preferably not less than 35.00 $mg/m^2$ because the output characteristics can be more excellent.

For the same reason, the Zn deposition amount of the zinc oxide layer 9 is preferably not more than 105.0 $mg/m^2$, and more preferably not more than 70.0 $mg/m^2$.

The Zn deposition amount of the zinc oxide layer 9 is determined as follows.

First, on a given portion of the zinc oxide layer 9, the X-ray fluorescence spectrometry is performed to measure an X-ray fluorescence intensity of zinc (Zn) by means of an X-ray fluorescence spectroscope (XRF device) under the conditions stated below. From the obtained X-ray fluorescence intensity of Zn, the Zn deposition amount (unit: $mg/m^2$) of the zinc oxide layer 9 is obtained using a calibration curve.

(Conditions of Measurement with XRF Device)

XRF device: EDX-7000 (manufactured by Shimadzu Corporation)

X-ray tube: Rhodium (Rh) target (voltage: 50 kV, current: 88 uA)

Primary filter: OPEN

Detector: Silicon drift semiconductor detector

Analysis region: 45 mm

Analysis time: 100 seconds

Dead time: 30%

Smoothing calculation method: Savitzky-Gloay

Number of smoothing points: 5

Number of repetition: 1

Background calculation: Auto

Sample form: Bulk (sample size: 16 mm×11 mm)

The calibration curve is prepared by, for example, the following procedures.

Specifically, first, the laminate 7 having the zinc oxide layer 9 whose X-ray fluorescence intensity of Zn has been measured is put in a mixture liquid of 16 mL of (1+1) hydrochloric acid and 2 mL of hydrofluoric acid and heated to dissolve the zinc oxide layer 9. Thereafter, zinc in the mixture liquid is quantified by an inductively coupled plasma (ICP) mass spectroscope (manufactured by Aglient Technologies, Aglilent8800). The calibration curve is prepared by repeating these procedures.

From the X-ray fluorescence intensity of Zn of the zinc oxide layer 9, the Zn deposition amount (unit: $mg/m^2$) of the zinc oxide layer 9 is determined using the calibration curve, for example, based on the following equation. However, an equation for determining the Zn deposition amount is not limited to the following equation.

$$\text{Zn deposition amount}=13.673\times(\text{X-ray fluorescence intensity of Zn})-2.284$$

<<S Value>>

For the zinc oxide layer 9, the S value represented by Formula (1) below is not more than 0.90. With this, the organic thin-film solar cell 1 using the laminate 7 has excellent output characteristics.

$$S = \beta/(\alpha + \beta) \tag{1}$$

The S value represents a hydroxy group amount or an oxide defect amount of the zinc oxide layer 9.

When the S value of the zinc oxide layer 9 exceeds 0.90, the output characteristics are insufficient. This is presumably because electrons generated in the organic semiconductor layer 4 are trapped in a hydroxy group or a defect structure such as an oxide defect in the electron transport layer 3 (zinc oxide layer 9), and the electrons are prevented from moving, which results in an increase in resistance and an increase in recombination probability between the electrons and holes.

On the other hand, it is assumed that when the S value of the zinc oxide layer 9 is smaller, electrons generated in the organic semiconductor layer 4 are less likely to be trapped in a hydroxy group or a defect structure such as an oxide defect in the electron transport layer 3 (zinc oxide layer 9), which makes the movement of the electrons easier and thus results in excellent output characteristics.

However, any other mechanisms than the foregoing are also regarded as being within the scope of embodiments of the invention.

The S value of the zinc oxide layer 9 is preferably not more than 0.75, more preferably 0.60 and more preferably 0.40 because this leads to further excellent output characteristics.

The lower limit of the S value of the zinc oxide layer 9 is not particularly limited and is, for example, 0.00, preferably 0.10 and more preferably 0.20.

An oxygen 1s spectrum (1s narrow-range photoelectron spectrum of oxygen) obtained by an X-ray photoelectron spectroscopy is separated into three peaks, and the S value of the zinc oxide layer 9 is determined from the areas of the two peaks on the low binding energy side.

More specifically, the S value is determined as described below.

First, on a given portion of the zinc oxide layer 9, measurement is carried out using an X-ray photoelectron spectroscope (XPS device) under the following conditions to obtain a 1s narrow-range photoelectron spectrum of oxygen. Next, the obtained 1s narrow-range photoelectron spectrum of oxygen is separated into three peaks. In the peak separation, function fitting is carried out using software, i.e., Igor Pro8 (Ver. 8.0.4.2). A cubic function is applied to a backline. A Gaussian function is applied to function fitting.

(Conditions of Measurement with XPS Device)

XPS device: Quantera SXM (manufactured by ULVAC-PHI, Inc.)

X-ray source: Monochromatic Al-Kα ray (voltage: 15 kV, output: 25.0 W)

X-ray beam diameter: 100-μmφ

Measurement range: 100-μmφ

Pass energy of narrow-range photoelectron spectrum measurement: 112 eV

Energy step of narrow-range photoelectron spectrum measurement: 0.1 eV

Charge neutralization: Electron beam+Ar+

Figure 3:
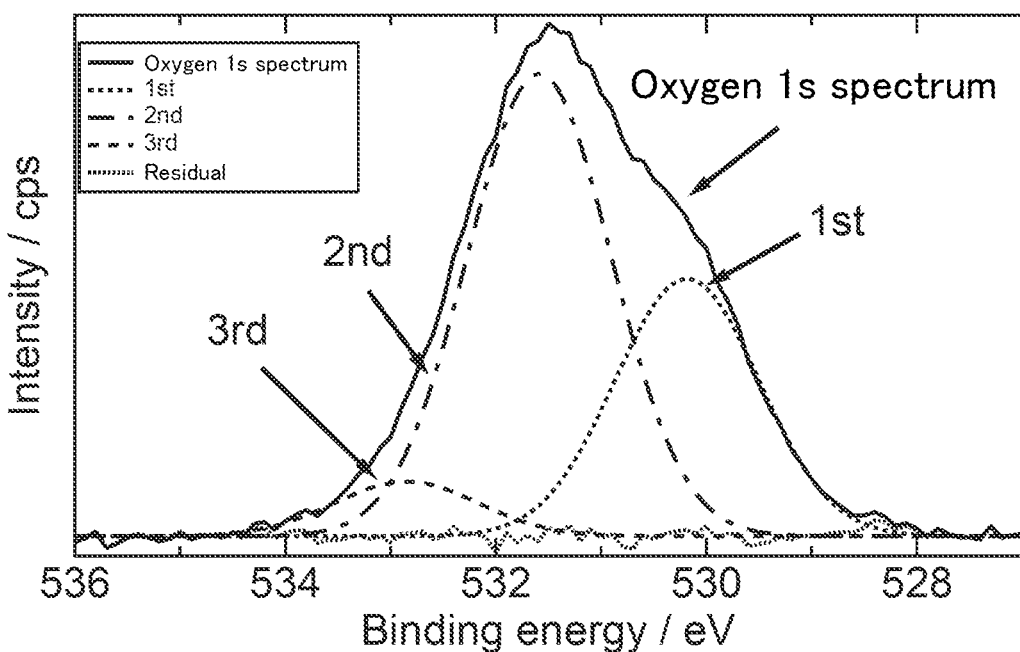
FIG. 3 is a 1s narrow-range photoelectron spectrum of oxygen in Inventive Example 5.

FIG. 3 is a 1s narrow-range photoelectron spectrum of oxygen in Inventive Example 5 to be described later. FIG. 3 also shows three peaks separated from this spectrum.

The three peaks are taken as a first peak, a second peak, and a third peak in the order from the low binding energy side. It is presumed that the first peak is a peak caused by a zinc-oxygen bond, the second peak is a peak caused by a hydroxy group or an oxygen defect, and the third peak is a peak caused by surface adsorption water.

Since the three peaks have peak positions close to one another, the binding energies of the peak tops of the respective peaks are set to the following ranges and limited such that the half-value widths of the three peaks become equal to one another. With the peak heights being used as variable parameters, convergence calculation is carried out such that a residual sum of squares with respect to the actually measured spectrum becomes minimum.

Backline: cubic function

First peak: not less than 529.0 eV and less than 530.7 eV

Second peak: not less than 530.7 eV and less than 532.2 eV

Third peak: not less than 532.2 eV and less than 534.0 eV

From the obtained fitting results, the area of the first peak (in which a binding energy of the peak top is in the range of not less than 529.0 eV and less than 530.7 eV), and the area of the second peak (in which a binding energy of the peak top is in the range of not less than 530.7 eV and less than 532.2 eV) are determined.

Then, the area of the first peak is taken as $\alpha$, and the area of the second peak is taken as $\beta$ to determine the S value from Formula (1) above. Here, the units of a and B are the same.

It is presumed that the third peak is a peak caused by the surface adsorption water and does not affect the chemical state of the zinc oxide. Therefore, the area of the third peak is excluded from the parameters of the above Formula (1) for determining the S value.

[Laminate Producing Method]

The laminate 7 described above is produced.

To be more specific, the member 8 is subjected to cathode polarization in a treatment solution containing a Zn component and a nitrate ion component. That is, current is applied with the member 8 being used as the cathode. Consequently, the zinc oxide layer 9 is formed on the member 8. For the counter electrode, an insoluble electrode such as a platinum electrode is suitable.

It is presumed that the zinc oxide layer 9 is formed as follows.

First, upon a reduction reaction from a nitrate ion to a nitrite ion, the pH increases at the surface of the member 8. As a result, for example, when the Zn component in the treatment solution is zinc nitrate, zinc hydroxide is generated. This zinc hydroxide adheres to the surface of the member 8, and through subsequent washing and dehydration condensation by drying or the like, the zinc oxide layer 9 is formed.

However, any other mechanisms than the foregoing are also regarded as being within the scope of embodiments of the invention.

As described above, the member 8 is preferably a member having electrical conductivity, e.g., a conductive metal oxide film such as an ITO film or an FTO film.

The member 8 may be disposed on a transparent substrate such as a glass substrate or a resin film, as described above. In this case, the transparent substrate having the member 8 (e.g., an ITO film-bearing glass substrate) is subjected to cathode polarization. In this case, the resulting laminate is to include this transparent substrate.

The treatment solution contains a Zn component (Zn compound). The Zn component supplies Zn (zinc element) to the zinc oxide layer 9 to be formed.

As the Zn component, preferred is at least one selected from the group consisting of zinc nitrate ($Zn(NO_3)_2$), zinc fluoride ($ZnF_2$), zinc chloride ($ZnCl_2$), zinc bromide ($ZnBr_2$), zinc sulfate ($ZnSO_4$), and zinc acetate ($Zn(CH_3COO)_2$).

The treatment solution contains the nitrate ion component.

As the nitrate ion component, preferred is at least one selected from the group consisting of zinc nitrate ($Zn(NO_3)_2$), nitric acid ($HNO_3$), sodium nitrate ($NaNO_3$), potassium nitrate ($KNO_3$), magnesium nitrate ($Mg(NO_3)_2$), calcium nitrate ($Ca(NO_3)_2$), and ammonium nitrate ($NH_4NO_3$).

One of the Zn component and the nitrate ion component may double as the other.

For example, when the Zn component is zinc nitrate, it doubles as the nitrate ion component.

For the sake of stability of the treatment solution, availability, and other factors, zinc nitrate is preferably used as the component that doubles as the Zn component and the nitrate ion component.

The Zn content of the treatment solution is preferably not more than 1.360 mol/L, more preferably not more than 1.000 mol/L, even more preferably not more than 0.400 mol/L, particularly preferably not more than 0.200 mol/L, and most preferably not more than 0.100 mol/L.

At the same time, the Zn content of the treatment solution is preferably not less than 0.001 mol/L, more preferably not less than 0.005 mol/L, and even more preferably not less than 0.010 mol/L.

Water is used as a solvent of the treatment solution.

The pH of the treatment solution is not particularly limited and is for example 2.0 to 5.0. Known acid components (e.g., phosphoric acid, sulfuric acid) or alkaline components (e.g., sodium hydroxide, ammonia water) may be used for pH adjustment.

The treatment solution may optionally contain a surfactant such as sodium lauryl sulfate or acetylenic glycol. The treatment solution may also contain condensed phosphate such as pyrophosphate for the sake of stability of deposition behavior over time.

From the viewpoint of decreasing the S value of the zinc oxide layer 9 to be obtained, the solution temperature of the treatment solution is preferably not lower than 20° C., more preferably not lower than 30° C. and even more preferably not lower than 40° C. When the solution temperature of the treatment solution is high, it is easy to exceed the activation energy of the dehydration reaction, so that hydroxy groups of the zinc oxide layer 9 to be formed decrease. Therefore, it is presumed that the S value decreases with an increase in the solution temperature of the treatment solution.

Meanwhile, the upper limit of the solution temperature of the treatment solution is not particularly limited and is, for instance, 90° C. and preferably 80° C.

The treatment solution may further contain a conduction aid.

Exemplary conduction aids include: sulfates such as potassium sulfate, sodium sulfate, magnesium sulfate and calcium sulfate; nitrates such as potassium nitrate, sodium nitrate, magnesium nitrate and calcium nitrate; and chloride salts such as potassium chloride, sodium chloride, magnesium chloride and calcium chloride.

The conduction aid content of the treatment solution is preferably 0.010 to 1.000 mol/L and more preferably 0.020 to 0.500 mol/L.

The current density during cathode polarization is preferably not less than 0.01 A/dm$^2$.

At the same time, the current density during cathode polarization is preferably not more than 5.00 A/dm$^2$, more preferably not more than 4.00 A/dm$^2$, and even more preferably not more than 1.00 A/dm$^2$. When the current density is within the foregoing range, the zinc oxide layer 9 that uniformly cover the surface of the member 8 is easily obtained.

The current application time is suitably set to obtain a desired Zn deposition amount of the zinc oxide layer 9.

The Zn deposition amount of the zinc oxide layer 9 increases with an increase in the electric quantity density which is a product of the current density and the current application time, and decreases with a decrease in the electric quantity density.

Next, described is a method of decreasing the S value using the cathode polarization conditions.

By decreasing the current density and increasing the current application time, the S value can be decreased without changing the Z deposition amount in the zinc oxide layer 9 to be obtained. The presumable mechanism is as follows.

In the treatment solution, hydroxide ions and water molecules are coordinated in the Zn component (zinc ions). The coordination number of the hydroxide ions increases with an increase in the pH.

When the current density is high, since the reduction reaction rate of the nitrate ion component (nitrate ions) is high, a large amount of hydroxide ions is generated, and the pH greatly increases in the vicinity of the member 8. As a result, a large amount of hydroxide ions is coordinated in the Zn component (zinc ions), the dehydration reaction cannot sufficiently proceed, and hydroxy groups remain in the zinc oxide layer 9 to be formed, so that the S value increases.

On the other hand, when the current density is low, since the reduction reaction rate of the nitrate ion component (nitrate ions) is relatively low, hydroxide ions are less generated, and an increase in the pH is little. As a result, since the coordination of the hydroxide ions with respect to the Zn component (zinc ions) is little, and further, the current application time is long, the dehydration reaction sufficiently proceeds, and hydroxy groups of the zinc oxide layer 9 to be formed decrease, so that the S value decreases.

When the Zn content (for example, the blended amount of zinc nitrate) of the treatment solution increases, the reduction reaction frequency of the nitrate ion component (nitrate ions) increases, the vicinity of the member 8 is brought into a high pH state in which the amount of the hydroxide ions is large, hydroxy groups remain in the zinc oxide layer 9 to be formed, so that the S value increases. Therefore, a decrease in the Zn content of the treatment solution is effective for decrease in the S value.

Following termination of cathode polarization, the member 8 provided with the zinc oxide layer 9 may be retained in the treatment solution. Probably, dissolution of the zinc oxide layer 9 proceeds with an increase in a retaining time. While the retaining time is not particularly limited, it is preferably a period of time that does not allow complete dissolution of the zinc oxide layer 9, and specifically, preferably not more than 30 seconds and more preferably not more than 2 seconds.

Cathode polarization may be followed by washing with water.

The washing method is not particularly limited, and one exemplary method is immersion in water after cathode polarization. The temperature of water (water temperature) for use in washing is preferably 40° C. to 90° C.

The washing time is preferably more than 0.5 seconds and preferably 1.0 to 5.0 seconds.

Further, drying may replace or follow the washing with water. The temperature and the method of drying are not particularly limited, and a drying process using a typical drier or electric furnace may be employed for example. The drying temperature is preferably not higher than 100° C.

[Method for Producing Organic Thin-Film Solar Cell]

The organic thin-film solar cell 1 including the light-transmissive electrode layer 2, the electron transport layer 3, the organic semiconductor layer 4, the hole transport layer 5 and the collector electrode layer 6 in this order is produced using the above-described laminate 7.

For instance, layers serving as the organic semiconductor layer 4, the hole transport layer 5 and the collector electrode layer 6 are sequentially formed on the zinc oxide layer 9 in the laminate 7.

The organic semiconductor layer 4 is formed by, for example, spin-coating a solution having P3HT and PCBM dissolved therein onto the zinc oxide layer 9 serving as the electron transport layer 3, followed by drying. Examples of a solvent of the solution include 2,6-dichlorotoluene, chloroform, chlorobenzene, and a mixture of two or more thereof.

The hole transport layer 5 is formed by, for example, spin-coating an aqueous dispersion of PEDOT/PSS onto the organic semiconductor layer 4, followed by drying.

The collector electrode layer 6 is formed by, for example, vapor-depositing metal such as Au onto the hole transport layer 5.

The methods for forming the respective layers are not limited to the foregoing methods, and known methods may be suitably used.

EXAMPLES

The present invention is specifically described below with reference to examples. However, the present invention should not be construed as being limited to the following examples.

<Preparation of Member Serving as Light-Transmissive Electrode Layer>

Prepared was an ITO film-bearing glass substrate (sheet resistance: 10 Ω/sq, manufactured by Ideal Star Inc.) having an ITO (Indium Tin Oxide) film laminated on one surface of a glass substrate (15 mm×35 mm, thickness: 0.7 mm, alkali-free glass) by sputtering. This ITO film-bearing glass substrate was used as a transparent substrate having a member serving as the light-transmissive electrode layer.

<Production of Laminate Serving as Light-Transmissive Electrode Layer and Electron Transport Layer>

A laminate serving as the light-transmissive electrode layer and the electron transport layer was produced using the prepared ITO film-bearing glass substrate (the transparent substrate having the member serving as the light-transmissive electrode layer) in the following manner.

First, prepared was a treatment solution containing zinc nitrate $(Zn(NO_3)_2)$ and having the pH adjusted to 4.4 by use of sodium hydroxide or sulfuric acid (hereinafter simply called "treatment solution").

In each treatment solution, the blended amount of zinc nitrate was adjusted such that the Zn content (unit: mol/L) meets each of the values shown in Table 1 below.

Next, the prepared ITO film-bearing glass substrate was immersed in a cleaning solution obtained by diluting Semi-clean M-4 (manufactured by Yokohama Oils & Fats Industry Co., Ltd.), which was a detergent, by 20 times with ion exchanged water, and subjected to ultrasonic cleaning for 10 minutes. Thereafter, the ITO film-bearing glass substrate was taken out from the cleaning solution, immersed in ion exchanged water, and subjected to ultrasonic cleaning for 10 minutes.

The cleaned ITO film-bearing glass substrate was immersed in the prepared treatment solution. The temperature (solution temperature) of the treatment solution was set to the temperature (unit: ° C.) shown in Table 1 below. The ITO film-bearing glass substrate was subjected to cathode polarization in the treatment solution under the cathode polarization conditions (current density, current application time) shown in Table 1 below, taken out from the treatment solution within 2 seconds from termination of the cathode polarization, and immersed in a water bath at 25° C. for 2.0 seconds for washing with water, followed by drying by a blower at room temperature.

Thus, a zinc oxide layer (16 mm×10 mm) serving as the electron transport layer was formed on the ITO film of the ITO film-bearing glass substrate. The ITO film-bearing glass substrate having the zinc oxide layer formed thereon (a laminate serving as the light-transmissive electrode layer and the electron transport layer) was produced in this manner.

<<Zn Deposition Amount>>

Of the produced laminate, the Zn deposition amount of the zinc oxide layer was determined according to the foregoing method. The results are shown in Table 1 below.

<<S Value>>

Of the produced laminate, the 1s narrow-range photoelectron spectrum of oxygen of the zinc oxide layer was obtained according to the foregoing method to determine the S value. The results are shown in Table 1 below.

As an example, FIG. 3 shows the 1s narrow-range photoelectron spectrum of oxygen in Inventive Example 5 with three peaks separated from this spectrum.

In FIG. 3, the area a of the first peak and the area B of the second peak were 18350 and 25526, respectively.

<Production of Organic Thin-Film Solar Cell>

In the following manner, an organic thin-film solar cell having a photoelectric conversion area of 4 mm×10 mm, that is, 0.4 cm$^2$ was produced using the produced laminate.

<<Formation of Organic Semiconductor Layer>>

A mixed solution was obtained by mixing 2,6-dichloro-toluene and chloroform at a volume ratio of 1:1. Into this mixed solution, P3HT (manufactured by Aldrich) and PCBM (manufactured by Frontier Carbon Corporation) were dissolved at a mass ratio of 5:4 such that the total concentration was 3.9 mass %.

The thus-obtained mixed solution was spin-coated onto the zinc oxide layer under the conditions of 1500 rpm and 60 seconds and dried at room temperature for about 10 minutes, thereby obtaining an organic semiconductor layer with a thickness of 250 nm.

<<Formation of Hole Transport Layer>>

Prepared was a nonionic surfactant (manufactured by Aldrich) containing 1 mass % of polyoxyethylene tridecyl ether (PTE: $C_{13}H_{27}(OCH_2CH_2)_6OH$) and 1 mass % of xylene and having water and isopropanol as solvents. This nonionic surfactant in an amount of 0.5 parts by mass was mixed to 100 parts by mass of 1.3 mass % aqueous PEDOT/PSS dispersion (manufactured by Aldrich) to obtain a PTE-containing aqueous PEDOT/PSS dispersion.

The PTE-containing aqueous PEDOT/PSS dispersion was heated to 70° C., spin-coated onto the organic semiconductor layer under the conditions of 6000 rpm and 60 seconds, and then naturally dried at room temperature, thereby forming a hole transport layer with a thickness of 80 nm.

<<Formation of Collector Electrode Layer>>

An Au electrode layer (collector electrode layer) was formed on the hole transport layer by vacuum deposition to have a thickness of about 100 nm.

More specifically, a shadow mask corresponding to an electrode shape of 4 mm×10 mm and the glass substrate on which the layers up to the hole transport layer had been formed were placed in a chamber. The pressure in the chamber was reduced using a rotary pump and a turbomolecular pump to achieve a pressure of not higher than $2 \times 10^{-3}$ Pa in the chamber. A gold wire was subjected to resistance heating in the chamber to form, via the shadow mask, a film of gold with a thickness of 100 nm on the hole transport layer. The film formation rate was set to 10 to 15 nm/min, and the pressure during the film formation was not higher than $1 \times 10^{-2}$ Pa.

The thus-obtained glass substrate on whose one surface the ITO film (light-transmissive electrode layer), the zinc oxide layer (electron transport layer), the organic semiconductor layer, the hole transport layer and the collector electrode layer had been formed was heated at 150° C. for 5 minutes and further held at 70° C. for 1 hour. Thereafter, atmospheric sealing was made. Thus, an organic thin-film solar cell was produced.

<Evaluation on Organic Thin-Film Solar Cell>

The following evaluation was conducted with the produced organic thin-film solar cell.

The organic thin-film solar cell was irradiated, from its ITO film side, with artificial sunlight having a spectrum distribution of AM 1.5G (IEC standard 60904-3) and a light intensity of 100 mW/cm² by use of a solar simulator (XES-502S, manufactured by SAN-EI Electric Co., Ltd.). In this state, a photocurrent-voltage profile of the organic thin-film solar cell was measured with a linear sweep voltammetry (LSV) measurement device (HZ-5000, manufactured by Hokuto Denko Corporation).

The maximum output was determined based on the obtained profile and evaluated according to the following criteria. The results are shown in Table 1 below. With a larger maximum output value, the output characteristics are rated as more excellent.

A: Maximum output of not less than 2.00 mW/cm²

B: Maximum output of not less than 1.00 mW/cm² and less than 2.00 mW/cm²

C: Maximum output of less than 1.00 mW/cm²

TABLE 1

| | Treatment solution | | Cathode polarization conditions | | Zinc oxide layer | | |
| | | | | Current | Zn | | |
| | Zn content [mol/L] | Solution temperature [° C.] | Current density [A/dm²] | application time [s] | deposition amount [mg/m²] | S value [—] | Evaluation |
|---|---|---|---|---|---|---|---|
| Inventive Example 1 | 0.060 | 60 | 0.02 | 68.5 | 52.3 | 0.38 | A |
| Inventive Example 2 | 0.060 | 80 | 0.25 | 4.7 | 59.1 | 0.31 | A |
| Inventive Example 3 | 0.060 | 60 | 0.25 | 10.5 | 102.0 | 0.27 | B |
| Inventive Example 5 | 0.060 | 60 | 0.25 | 5.5 | 57.4 | 0.58 | A |
| Inventive Example 6 | 0.060 | 60 | 0.25 | 3.0 | 28.6 | 0.59 | B |
| Inventive Example 7 | 0.060 | 40 | 0.25 | 5.5 | 58.8 | 0.71 | A |
| Inventive Example 8 | 0.100 | 60 | 0.25 | 5.5 | 55.6 | 0.69 | A |
| Inventive Example 9 | 0.200 | 80 | 0.25 | 4.7 | 61.9 | 0.75 | A |
| Inventive Example 10 | 0.200 | 60 | 0.25 | 4.9 | 52.6 | 0.78 | B |
| Inventive Example 11 | 0.400 | 60 | 0.25 | 4.5 | 51.7 | 0.87 | B |
| Inventive Example 12 | 0.060 | 60 | 0.25 | 7.5 | 67.3 | 0.39 | A |
| Inventive Example 13 | 0.060 | 60 | 0.25 | 5.0 | 41.3 | 0.58 | A |
| Inventive Example 14 | 0.060 | 60 | 1.00 | 1.5 | 49.1 | 0.79 | B |
| Inventive Example 15 | 0.100 | 60 | 1.00 | 1.5 | 54.9 | 0.81 | B |
| Comparative Example 1 | 0.060 | 60 | 0.25 | 2.0 | 17.0 | 0.65 | C |
| Comparative Example 2 | 0.400 | 40 | 0.25 | 4.8 | 53.8 | 0.98 | C |

<Summary of Evaluation Results>

In Table 1 above, the underlined figures are those outside of the ranges of the invention.

As shown in FIG. 1 above, Inventive Examples 1 to 3 and 5 to 15 in which the Zn deposition amount of the zinc oxide layer was not less than 20.0 mg/m$^2$ and not more than 120.0 mg/m$^2$ and the S value of the zinc oxide layer was not more than 0.90 had good output characteristics.

In particular, Inventive Examples 1, 2, 5, 7 to 9, 12 and 13 in which the Zn deposition amount of the zinc oxide layer was not less than 35.0 mg/m$^2$ and not more than 70.0 mg/m$^2$ and the S value was not more than 0.75 had better output characteristics.

On the other hand, Comparative Example 1 in which the Zn deposition amount of the zinc oxide layer was too small and Comparative Example 2 in which the S value of the zinc oxide layer was too large had insufficient output characteristics.

It is presumed that in Comparative Example 2, since the Zn content (blended amount of zinc nitrate) of the treatment solution was high, the reduction reaction frequency of the nitrate ions increased, so that a large amount of the hydroxide ions was coordinated to the zinc ions. It is presumed that since a large amount of the hydroxide ions was present, the dehydration reaction could not sufficiently proceed, and further, the solution temperature of the treatment solution was low, so that it was difficult to exceed the activation energy of the dehydration reaction, and the S value increased.

<<Zn Deposition Amount>>

The Zn deposition amount increases with an increase in the electric quantity density that is a product of the current density and the current application time.

Comparing Inventive Examples 3, 5, 6, 12 and 13 with Comparative Example 1 which differ only in the current application time, the Zn deposition amount increased with an increase in the current application time.

When the current application time increased such that the Zn deposition amount was not less than 20.0 mg/cm$^2$, the evaluation of the output characteristics was "B." Further, when the current application time increased such that the Zn deposition amount was not less than 35.0 mg/cm$^2$ and not more than 70.0 mg/cm$^2$, the evaluation of the output characteristics was improved to "A." Presumably, this is because current leakage could be more suppressed with an increase in the Zn deposition amount.

As shown in Inventive Example 3, when the current application time was further increased such that the Zn deposition amount exceeded 70.0 mg/cm$^2$, the evaluation of the output characteristics was "B." Presumably, this is because transfer resistance of electrons to be generated increased in the organic semiconductor layer adjacent to the electron transport layer (zinc oxide layer) with an increase in the Zn deposition amount.

To obtain nearly the same Zn deposition amount with different current densities is different, the current application time is decreased when the current density is high, and the current application time is increased when the current density is low.

As shown in Inventive Examples 1, 5 and 14, even when the current density varied, nearly the same Zn deposition amount could be obtained by adjusting the current application time. It is presumed that since the reduction reaction rate of the nitrate ions increased with an increase in the current density, the desired Zn deposition amount could be obtained with the short current application time.

<<S Value>>

As shown in Inventive Examples 1, 5 and 14 having nearly the same Zn deposition amount and differing in the current density and the current application time, the S value decreased with a decrease in the current density and an increase in the current application time.

Also in Inventive Examples 8 and 15, the S value decreased with a decrease in the current density and an increase in the current application time.

In particular, Inventive Examples 1, 5 and 8 had the S value of not more than 0.75, so that the evaluation of the output characteristics was improved to "A."

As shown in Inventive Examples 5, 8, 10 and 11 differing only in the Zn deposition amount (blended amount of zinc nitrate) of the treatment solution, the S value decreased with a decrease in the Zn content of the treatment solution.

Also in comparison between Inventive Example 14 and Inventive Example 15 and comparison between Inventive Example 7 and Comparative Example 2, the S value decreased with a decrease in the Zn content of the treatment solution.

In particular, Inventive Examples 5, 8 and 7 have the S value of not more than 0.75, so that the evaluation of the output characteristics was improved to "A."

As shown in Inventive Examples 2, 5 and 7 differing only in the solution temperature of the treatment solution, the S value decreased with an increase in the solution temperature of the treatment solution. Since all of these Inventive Examples had the S value of not more than 0.75, the evaluation of the output characteristics was "A."

Also in comparison between Inventive Example 9 and Inventive Example 10 and comparison between Inventive Example 11 and Comparative Example 2, the S value decreased with an increase in the solution temperature of the treatment solution. In particular, the S value of Inventive Example 9 was not more than 0.75, so that the evaluation of the output characteristics was improved to "A."

REFERENCE SIGNS LIST 1 organic thin-film solar cell
2 light-transmissive electrode layer
3 electron transport layer
4 organic semiconductor layer
5 hole transport layer
6 collector electrode layer
7 laminate
8 member serving as light-transmissive electrode layer
9 zinc oxide layer

The invention claimed is:

1. A laminate serving as a light-transmissive electrode layer and an electron transport layer of an organic thin-film solar cell including the light-transmissive electrode layer, the electron transport layer, an organic semiconductor layer, a hole transport layer and a collector electrode layer in this order, the laminate comprising:

a member that serves as the light-transmissive electrode layer; and a zinc oxide layer that is disposed on the member serving as the light-transmissive electrode layer and serves as the electron transport layer, wherein the zinc oxide layer has a Zn deposition amount of not less than 20.0 mg/m$^2$ and not more than 120.0 mg/m$^2$, and when, in the zinc oxide layer, an oxygen 1s spectrum obtained by X-ray photoelectron spectroscopy is separated into three peaks, an area of a peak in which a binding energy of a peak top is in a range of not less than 529.0 eV and less than 530.7 eV is represented by α, and an area of a peak in which a binding energy of a peak top is in a range of not less than 530.7 eV and less than 532.2 eV is represented by β, an S value represented by Formula (1) is not more than 0.90:

$$S = \beta/(\alpha + \beta). \tag{1}$$

2. An organic thin-film solar cell including a light-transmissive electrode layer, an electron transport layer, an organic semiconductor layer, a hole transport layer and a collector electrode layer in this order and using the laminate according to claim 1.

3. A laminate producing method for producing the laminate according to claim 1, the method comprising:

subjecting the member serving as the light-transmissive electrode layer to cathode polarization in a treatment solution containing a Zn component and a nitrate ion component to thereby form the zinc oxide layer on the member serving as the light-transmissive electrode layer.

4. An organic thin-film solar cell producing method for producing an organic thin-film solar cell including a light-transmissive electrode layer, an electron transport layer, an organic semiconductor layer, a hole transport layer and a collector electrode layer in this order by using the laminate according to claim 1.

\* \* \* \* \*